US011251197B2

(12) United States Patent
Lee

(10) Patent No.: US 11,251,197 B2
(45) Date of Patent: Feb. 15, 2022

(54) SEMICONDUCTOR DEVICE

(71) Applicant: Samsung Electronics Co., Ltd., Suwon-si (KR)

(72) Inventor: Sanghoon Lee, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/927,044

(22) Filed: Jul. 13, 2020

(65) Prior Publication Data

US 2021/0134833 A1 May 6, 2021

(30) Foreign Application Priority Data

Oct. 31, 2019 (KR) .................. 10-2019-0137329

(51) Int. Cl.
*H01L 29/792* (2006.01)
*H01L 27/1157* (2017.01)
(Continued)

(52) U.S. Cl.
CPC .... *H01L 27/11582* (2013.01); *H01L 23/5226* (2013.01); *H01L 27/11565* (2013.01); *H01L 27/11573* (2013.01)

(58) Field of Classification Search
CPC ........... H01L 29/66712; H01L 29/7802; H01L 29/66734; H01L 29/7813; H01L 21/823462; H01L 21/823857; H01L 2029/7858; H01L 21/28282; H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/66833; H01L 29/785; H01L 29/792; H01L 2924/13067; H01L 27/11524; H01L 27/1157; H01L 27/11578;
(Continued)

(56) References Cited

U.S. PATENT DOCUMENTS

| 5,239,196 A * | 8/1993 | Ikeda | ..... | H01L 27/11 257/385 |
| 8,431,969 B2 * | 4/2013 | Kim | ..... | H01L 29/7926 257/211 |

(Continued)

*Primary Examiner* — Mary A Wilczewski
*Assistant Examiner* — Tsz K Chiu
(74) *Attorney, Agent, or Firm* — Harness, Dickey & Pierce, P.L.C.

(57) ABSTRACT

A semiconductor device including a lower structure, an upper pattern, a stacked structure, a separation structure passing through the stacked structure, a vertical structure comprising a channel layer, wherein the stacked structure comprises a plurality of interlayer insulating layers and a plurality of gate layers, the lower structure comprises a first lower pattern and a second lower pattern of a material different from a material of the first lower pattern, the first lower pattern comprises a first portion between the second lower pattern and the channel layer, a second portion extending from the first portion to a region between the second lower pattern and the upper pattern, and a third portion extending from the first portion to a region between the second lower pattern and the substrate structure, and the first lower pattern does not extend toward a side surface of the upper pattern.

20 Claims, 15 Drawing Sheets

(51) Int. Cl.
  *H01L 27/11582* (2017.01)
  *H01L 23/522* (2006.01)
  *H01L 27/11573* (2017.01)
  *H01L 27/11565* (2017.01)

(58) Field of Classification Search
  CPC ............ H01L 27/1582; H01L 29/7808; H01L 27/11273; H01L 27/11517; H01L 29/788; H01L 29/42324; H01L 29/66825; H01L 2924/13081; H01L 2924/13085; H01L 29/6684; H01L 29/78391; H01L 29/4236
  See application file for complete search history.

(56) References Cited

U.S. PATENT DOCUMENTS

| | | | |
|---|---|---|---|
| 8,441,059 B2 * | 5/2013 | Sim | G11C 16/26 257/324 |
| 8,559,224 B2 * | 10/2013 | Han | G11C 16/16 365/185.11 |
| 8,570,805 B2 * | 10/2013 | Lee | G11C 16/0483 365/185.17 |
| 8,829,595 B2 * | 9/2014 | Lee | H01L 27/11582 257/324 |
| 9,224,752 B1 | 12/2015 | Lee et al. | |
| 9,455,263 B2 | 9/2016 | Zhang et al. | |
| 9,508,730 B2 | 11/2016 | Lee et al. | |
| 9,530,781 B2 | 12/2016 | Miyamoto et al. | |
| 9,985,098 B2 | 5/2018 | Matsumoto et al. | |
| 9,997,538 B2 | 6/2018 | Son et al. | |
| 10,128,262 B2 * | 11/2018 | Koval | H01L 21/32133 |
| 10,276,583 B2 * | 4/2019 | Sharangpani | H01L 21/441 |
| 2010/0038699 A1 * | 2/2010 | Katsumata | H01L 27/11582 257/324 |
| 2012/0140562 A1 * | 6/2012 | Choe | H01L 29/7926 365/185.18 |
| 2015/0380418 A1 | 12/2015 | Zhang et al. | |
| 2018/0122904 A1 | 5/2018 | Matsumoto et al. | |
| 2018/0130816 A1 | 5/2018 | Son et al. | |

\* cited by examiner

SEMICONDUCTOR DEVICE

CROSS-REFERENCE TO RELATED APPLICATION

Korean Patent Application No. 10-2019-0137329, filed on Oct. 31, 2019, in the Korean Intellectual Property Office, and entitled: "Semiconductor Device," is incorporated by reference herein in its entirety.

BACKGROUND

1. Field

The present disclosure relates to a semiconductor device including a lower structure between a substrate and a stacked structure and a method of forming the semiconductor device.

2. Description of the Related Art

To improve integration density of the semiconductor device, a semiconductor device including gates laminated while being spaced apart in a direction perpendicular to an upper surface of the substrate has been developed. As a number of laminated gates increases, an unexpected process defect may occur, thereby giving rise to improved productivity of the semiconductor device.

SUMMARY

A technical problem of the present disclosure is to provide a semiconductor device having improved reliability.

Another technical problem is to provide a semiconductor device having improved integration density.

A semiconductor device according to example embodiments is provided. The semiconductor device includes a substrate structure; a lower structure on the substrate structure; an upper pattern on the lower structure; a stacked structure on the lower structure; separation structures passing through the stacked structure; a vertical structure between the separation structures and passing through the stacked structure, the upper pattern and the lower structure extending into the substrate structure and comprising a channel layer; a contact plug on the vertical structure; and a conductive line on the contact plug, wherein the stacked structure comprises a plurality of interlayer insulating layers and a plurality of gate layers alternately and repeatedly stacked, the lower structure comprises a first lower pattern and a second lower pattern of a material different from a material of the first lower pattern, the first lower pattern comprises a first portion between the second lower pattern and the channel layer, a second portion extending from the first portion to a region between the second lower pattern and the upper pattern, and a third portion extending from the first portion to a region between the second lower pattern and the substrate structure, and the first lower pattern does not extend toward a side surface of the upper pattern.

A semiconductor device according to some embodiments is provided. The semiconductor device includes a lower structure on a substrate; an upper pattern on the lower structure; a stacked structure on the lower structure; a vertical structure passing through the stacked structure, the upper pattern and the lower structure extending into the substrate; and a separation structure passing through the stacked structure, the upper pattern and the lower structure and spaced apart from the vertical structure, wherein the upper pattern comprises an upper portion parallel to the upper surface of the substrate structure and a support portion extending from the upper portion and in contact with the substrate, the lower structure is between the upper portion of the upper pattern and the substrate structure, the separation structure comprises a first separation portion passing through the stacked structure, the upper portion of the upper pattern and the lower structure, and a second separation portion passing through the stacked structure and in contact with the support portion of the upper pattern, the stacked structure comprises a plurality of gate layers stacked and spaced apart in a direction perpendicular to an upper surface of the substrate, the vertical structure comprises a channel layer passing through a plurality of gate layers, the upper portion of the upper pattern, and the lower structure and extending into the substrate, the lower structure comprises a first lower pattern and a second lower pattern of a material different from a material of the first lower pattern, and the first lower pattern comprises a first portion between the second lower pattern and the channel layer, a second portion extending from the first portion to a region between the second lower pattern and the upper pattern, and a third portion extending from the first portion to a region between the second lower pattern and the substrate.

A semiconductor device according to some embodiments is provided. The semiconductor device includes a lower structure on a substrate; an upper pattern on the lower structure; a stacked structure on the upper pattern; a vertical structure passing through the stacked structure and the lower structure and the upper pattern and extending into the substrate; and a separation structure passing through the stacked structure, the upper pattern and the lower structure and spaced apart from the vertical structure, wherein the stacked structure comprises a plurality of gate layers spaced apart in a direction perpendicular to an upper surface of the substrate while being stacked, the vertical structure comprises a channel layer passing through a plurality of the gate layers, the upper pattern and the lower structure and extending into the substrate, and the lower structure comprises a first lower pattern and a second lower pattern of a material having etching selectivity with respect to the first lower pattern, wherein the first lower pattern comprises a first portion between the second lower pattern and the channel layer, a second portion extending from the first portion to a region between the second lower pattern and the upper pattern, and a third portion extending from the first portion to a region between the second lower pattern and the substrate structure, and at least one of the second portion of the first lower pattern, the third portion of the first lower pattern and the second lower pattern has a surface recessed more than a side surface of the upper pattern.

BRIEF DESCRIPTION OF DRAWINGS

Features will be apparent to those of skill in the art by describing in detail example embodiments with reference to the attached drawings in which.

DETAILED DESCRIPTION

Figure 1:
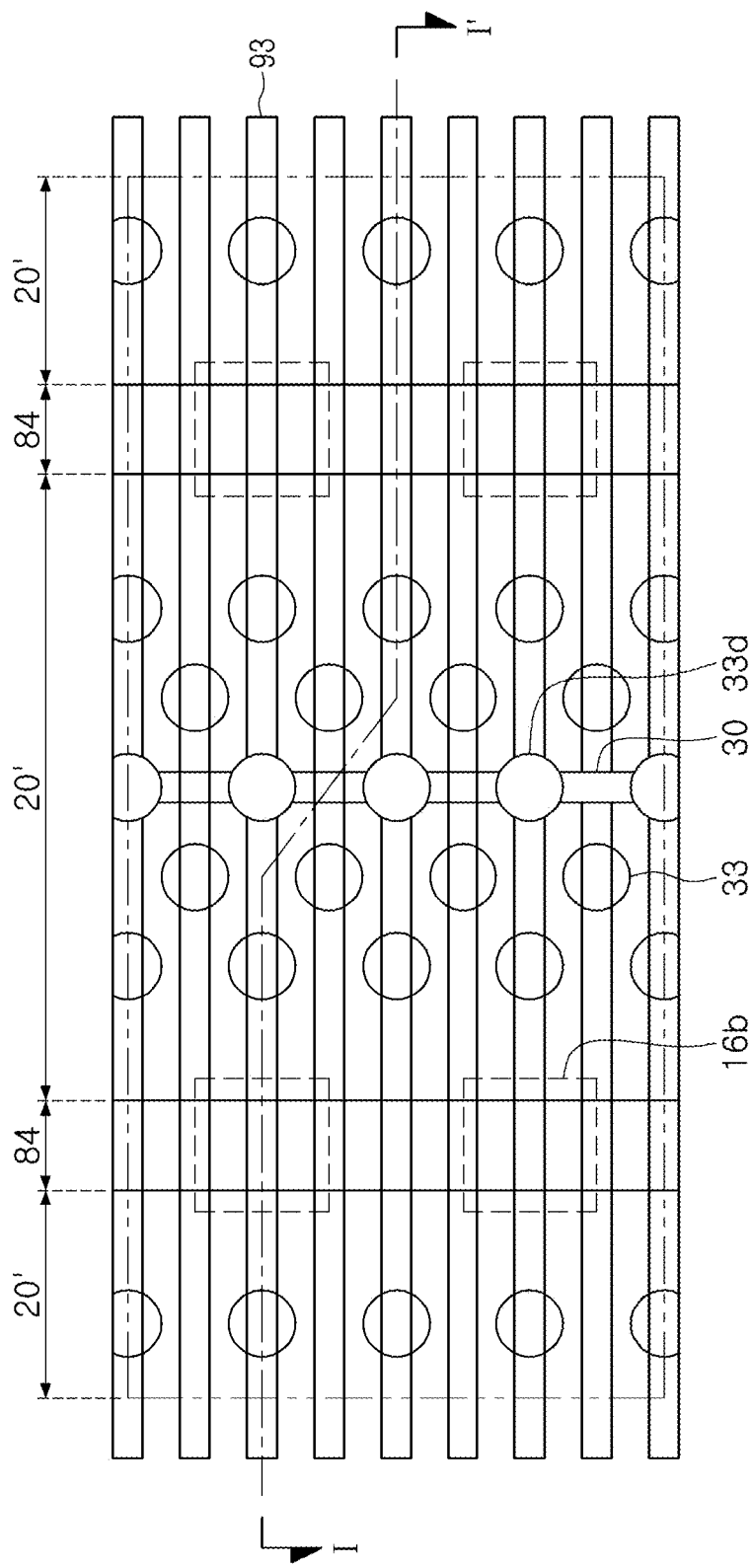
FIG. 1 is a plan view of a semiconductor device according to example embodiments.
Figure 2:
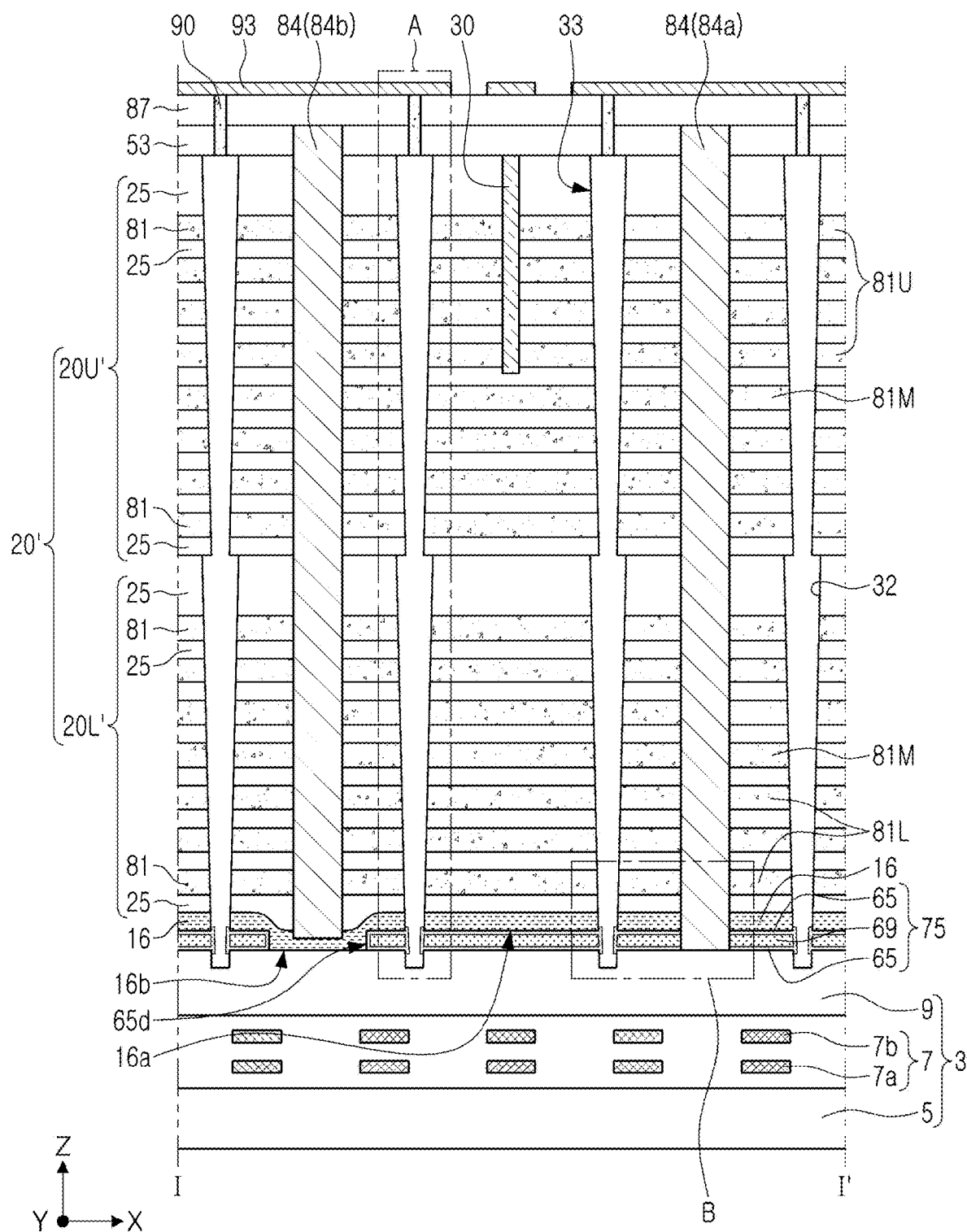
FIG. 2 is a cross-sectional view of a region taken along line I-I' of FIG. 1.
Figure 3A:
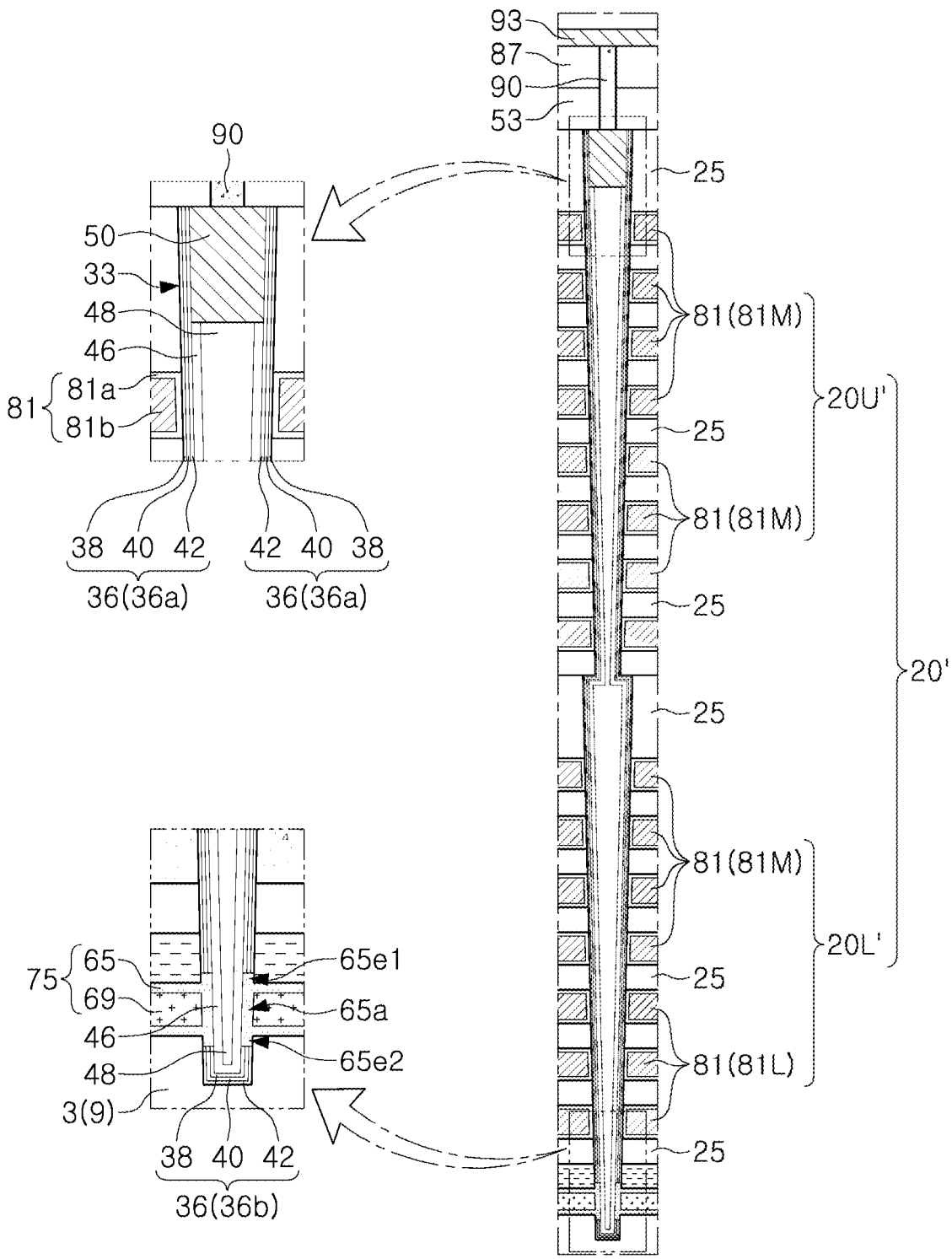
FIGS. 3A and 3B are enlarged cross-sectional views of portions of FIG. 2.
Figure 3B:
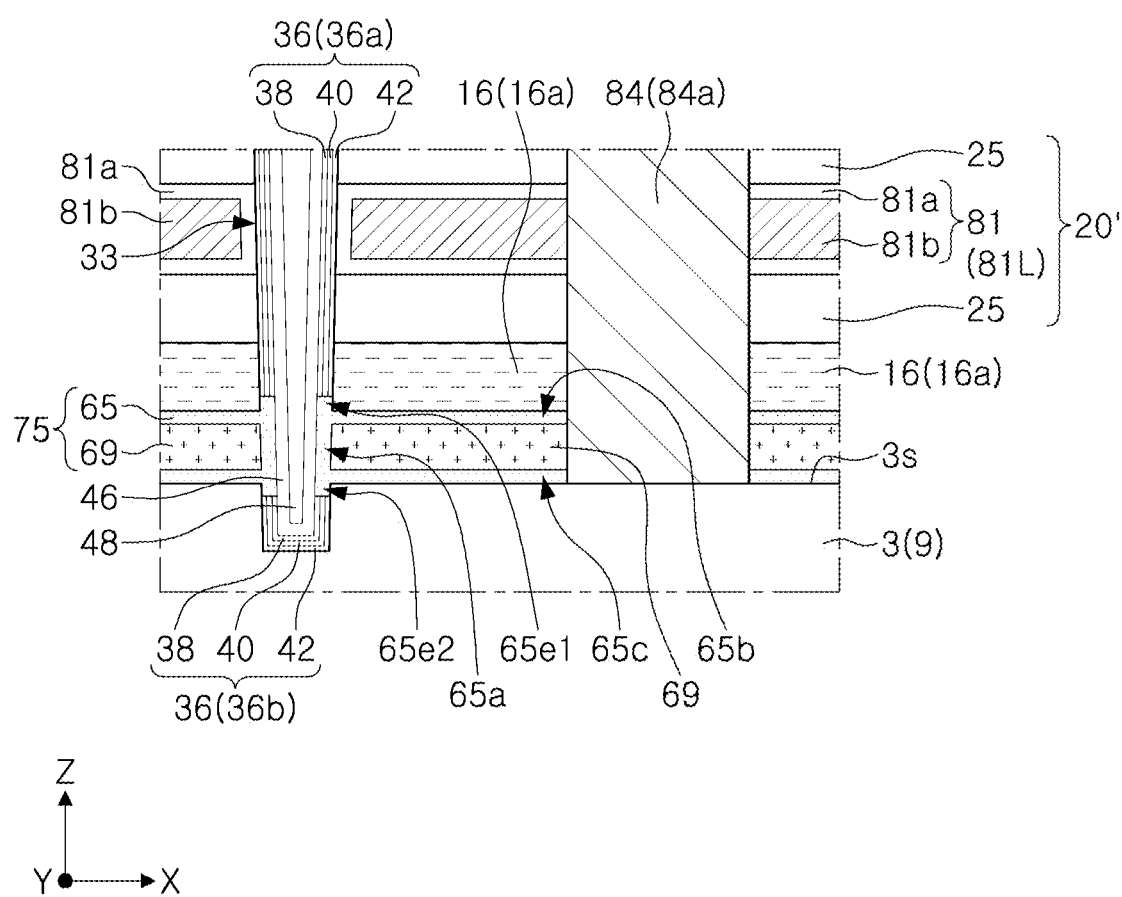

Hereinafter, a semiconductor device according to example embodiments will be described with reference to FIGS. 1, 2, 3A and 3B. FIG. 1 is a plan view of a semiconductor device according to example embodiments, and FIG. 2 is a cross-sectional view of a region taken along line I-I' of FIG. 1. FIG. 3A is an enlarged cross-sectional view of region "A" of FIG. 2, and FIG. 3B is an enlarged cross-sectional view of region "B" of FIG. 2.

Based on FIGS. 1, 2, 3A and 3B, a substrate structure 3 may be provided. In an example, the substrate structure 3 may include a lower substrate 5, a peripheral circuit region 7 on the lower substrate 5, and/or an upper substrate 9 on the peripheral circuit region 7.

In an example, the lower substrate 5 may be a semiconductor substrate, such as a single crystal silicon substrate, or the like. The upper substrate 9 may be an N-type conductive polysilicon substrate.

In another example, the upper substrate 9 may include at least one conductive material of a metal nitride (e.g., titanium nitride (TiN), tungsten nitride (WN), or the like), a metal-semiconductor compound (e.g., titanium silicon (TiSi), tungsten silicon (WSi), or the like) and a metal (e.g., tungsten (W), or the like) and a polysilicon layer on a layer of the conductive material.

In an example, the peripheral circuit region 7 may include a peripheral circuit 7$a$ and a lower insulating layer 7$b$ covering the peripheral circuit 7$a$. A lower structure 75 may be disposed on the substrate structure 3. An upper pattern 16 may be disposed on the lower structure 75. A stacked structure 20' may be disposed on the upper pattern. A first upper insulating layer 53 may be disposed on the stacked structure 20'. Separation structures 84 passing through the first upper insulating layer 53 and the stacked structure 20' may be disposed.

A vertical structure 33 passing through the stacked structure 20', the upper pattern 16 and the lower structure 75 and extending into the substrate structure 3 may be disposed between the separation structures 84. A second upper insulating layer 87 may be disposed on the first upper insulating layer 53. A contact plug 90 passing through the second upper insulating layer 87 and the first upper insulating layer 53 and electrically connected to the vertical structure 33 may be disposed. A conductive line 93 may be disposed on the contact plug 90.

In an example, the conductive line 93 may have a shape of being extended in a first horizontal direction X, while the separation structures 84 may have a line shape extending in a second horizontal direction Y perpendicular to the first horizontal direction X. The first and second horizontal directions X and Y may be parallel to an upper surface 3$s$ of the substrate structure 3.

The stacked structure 20' may include a lower stacked structure 20L' and an upper stacked structure 20U' on the lower stacked structure 20L'.

The lower stacked structure 20L' and the upper stacked structure 20U' may include a plurality of interlayer insulating layers 25 and a plurality of horizontal layers 81 alternately and repeatedly stacked in a vertical direction Z. The vertical direction Z may refer to a direction perpendicular to the upper surface 3$s$ of the substrate structure 3.

The stacked structure 20' may include a lower stacked structure 20L' and an upper stacked structure 20U' on the lower stacked structure 20L'.

In the lower stacked structure 20L and the upper stacked structure 20U, an uppermost insulating layer of the interlayer insulating layers 25 may be thicker than interlayer insulating layers between the horizontal layers 81.

In an example, the interlayer insulating layers 25 may be formed of a silicon oxide.

In an example, each horizontal layer 81 may include a conductive material.

In an example, each horizontal layer 81 may include a first layer 81$a$ and a second layer 81$b$. The first layer 81$a$ is located between the second layer 81$b$ and the vertical structure 33 and may cover upper and lower surfaces of the second layer 81$b$.

In an example, the first and second layers 81$a$ and 81$b$ may be formed of different materials. For example, the second layer 81$b$ may be formed of a conductive material, such as doped silicon, a metal nitride (e.g., TiN, WN, or the like), a metal-semiconductor compound (e.g., TiSi, WSi, or the like) or a metal (e.g., W, or the like), whereas the first layer 81$a$ may be formed of an insulating material. The first layer 81$a$ may be formed of a high-k dielectric such as an aluminum oxide (AlO).

In another example, the first layer 81$a$ may be formed of a metal nitride (e.g., TiN, WN, or the like), while the second layer 81$b$ may be formed of a metal (e.g., W, or the like).

In another example, the horizontal layers 81 may be formed of at least one conductive material, such as doped silicon, a metal nitride (e.g., TiN, WN, or the like), a metal-semiconductor compound (e.g., TiSi, WSi, or the like) or a metal (e.g., W, or the like).

The horizontal layers 81 may be gate layers. A portion in the horizontal layers 81, which are formed of a conductive material, may be gate electrodes. For example, in some example embodiments in which the first layer 81$a$ is formed of an insulating material and the second layer 81$b$ is formed of a conductive material, the second layers 81$b$ of the horizontal layers 81 may be gate layers.

The horizontal layers 81 may include a plurality of lower gate layers 81L, a plurality of middle gate layers 81M on a plurality of the lower gate layers 81L and a plurality of upper gate layers 81U on a plurality of the middle gate layers 81M.

An insulating separation pattern 30 may be disposed partially in the stacked structure 20'. The insulating separation pattern 30 may be formed of an insulating material such as a silicon oxide, or the like. The insulating separation pattern 30 may pass through a plurality of the upper gate layers 81U. The insulating separation pattern 30 may be disposed on a plurality of the middle gate layers 81M.

The vertical structures 33 may be disposed in plural. Some of a plurality of the vertical structures 33 may pass through the insulating separation pattern 30. As previously described, some of the vertical structures passing through the insulating separation pattern 30 may be a dummy vertical structure 33d.

The vertical structure 33 may include a core region 48, a pad pattern 50 on the core region 48, a channel layer 46 covering a side surface and a bottom surface of the core region 48 and in contact with the pad pattern 50, and a dielectric structure 36 surrounding an external side surface of the channel layer 46.

The channel layer 46 may be formed of a semiconductor material. The channel layer 46 may be formed of a polysilicon. The pad pattern 50 may be formed of a polysilicon, for example, an N-type conductive polysilicon. The pad pattern 50 may be in contact with the contact plug 90. The core region 48 may include an insulating material, or an insulating material in which a void is formed.

The dielectric structure 36 may include a first dielectric layer 38, a second dielectric layer 42 and a data storage material layer 40 between the first and second dielectric layers 38 and 42. The first dielectric layer 38 may be disposed between the data storage material layer 40 and the stacked structure 20', and the second dielectric layer 42 may be disposed between the data storage material layer 40 and the channel layer 46. The data storage material layer 40 may be a charge trap layer, such as a silicon nitride. The data storage material layer 40 may include regions capable of storing information in a semiconductor device such as a vertical NAND flash memory device, or the like.

In an example, at least a lowermost lower gate layer of a plurality of the lower gate layers 81L may be a gate layer of an erasing transistor utilized in erasing a vertical NAND flash memory device using gate induced drain leakage (GIDL).

In an example, a gate layer among a plurality of the lower gate layers 81L, which is located on the gate layer of the erasing transistor utilized in erasing, may be a ground selection layer of a ground selection transistor.

In an example, at least a few of a plurality of the middle gate layers 81M may be word lines of the vertical NAND flash memory forming memory cells.

In an example, at least an uppermost gate layer of a plurality of the upper gate layers 81U may be a gate layer of an erasing transistor utilized in erasing a vertical NAND flash memory device using gate induced drain leakage (GIDL).

In an example, a single or a plurality of the gate layers among a plurality of the upper gate layers 81U, which are located in a lower portion of the erasing transistor gate layer, may be gate layers of a string selection transistor of the vertical NAND flash memory device.

The dielectric structure 36 may include a first dielectric structure 36a and a second dielectric structure 36b, which are spaced apart.

The first dielectric structure 36a is in contact with the horizontal layers 81 while being in contact with a portion of the upper pattern 16. The second dielectric structure 36b may be in contact with the substrate structure 3.

The upper pattern 16 may extend from a horizontal portion 16a on the lower structure 75 and a support portion 16b extending from the horizontal portion 16a in contact with the substrate structure 3. The horizontal portion 16a may be disposed between the lower structure 74 and the stacked structure 20'.

The lower structure 75 may include a first lower pattern 65 and a second lower pattern 69. The first lower pattern 65 and the second lower pattern 69 may be formed of different materials. The first lower pattern 65 may be formed of a silicon material. The first lower pattern 65 may be formed of a doped polysilicon, for example, an N-type conductive polysilicon.

The second lower pattern 69 may be formed of a material having etching selectivity to the material of the first lower pattern 65. For example, the second lower pattern 69 may be formed of an insulating material, for example, a silicon oxide. The second lower pattern 69 may be replaced with a material different from the silicon oxide. For example, the second lower pattern 69 may be replaced with a conductive material (e.g., TiN, TaN, WN, TiSi, WSi, TaSi, W, Ta, Ti, or the like) different from the material of the first lower pattern 65.

In an example, the first lower pattern 65 and the upper pattern 16 may be formed of an identical material, such as a polysilicon.

In an example, the first lower pattern 65 and the second lower pattern 69 may not extend toward a side surface of the upper pattern 16. The first and second lower patterns 65 and 69 may not extend toward a region between the side surface of the upper pattern 16 and the separation structures 84.

The second lower pattern 69 may be spaced apart from the substrate structure 3 and the upper pattern 16.

The first lower pattern 65 may include a first portion 65a located between the second lower pattern 69 and the channel layer 46, a second portion 65b extending from the first portion 65a to a region between the second lower pattern 69 and the upper pattern 16, and a third portion 65c extending from the first portion 65a to the second lower pattern 69 and the substrate structure 3.

The first lower pattern 65 may further include an upper extension portion 65e1 extending from the first portion 65a to a region between the upper pattern 16 and the channel layer 46 and a lower extension portion 65e2 extending to a region between the substrate structure 3 and the channel layer 46. The upper extension portion 65e1 may be in contact with the first dielectric structure 36a, and the lower extension portion 65e2 may be in contact with the second dielectric structure 36b.

The first portion 65a, the upper extension portion 65e1 and the lower extension portion 65e2 in the first lower pattern 65 may be in contact with the channel layer 46.

The first lower pattern 65 may extend from the second portion 65b and the third portion 65c and may further include a fourth portion 65d located between the second lower pattern 69 and the support portion 16b of the upper pattern 16.

The separation structures 84 may include an insulating material. For example, the separation structures 84 may be formed of an insulating material such as a silicon oxide, or the like. In another example, the separation structures 84 may include an insulating material and an insulating material electrically isolating the conductive material and the stacked structure 20'.

The separation structures 84 may include a first separation portion 84a passing through the horizontal portion 16a of the upper pattern 16 and the lower structure 75 and a second separation portion 84b in contact with the support portion 16b of the upper pattern 16.

In separation structures 84, the first separation portion 84a may be in contact with the lower structure 75 and the second separation portion 84b may be spaced apart from the lower structure 75.

In embodiments, by filling with the lower structure 75 including the first and second lower patterns 65 and 69 formed of different materials between the horizontal portion 16a of the upper pattern 16 and the substrate structure 3, a defect, which may occur between the horizontal portion 16a of the upper pattern 16 and the substrate structure 3, may be reduced or prevented. Accordingly, a semiconductor device having improved reliability may be provided.

Figure 4A:
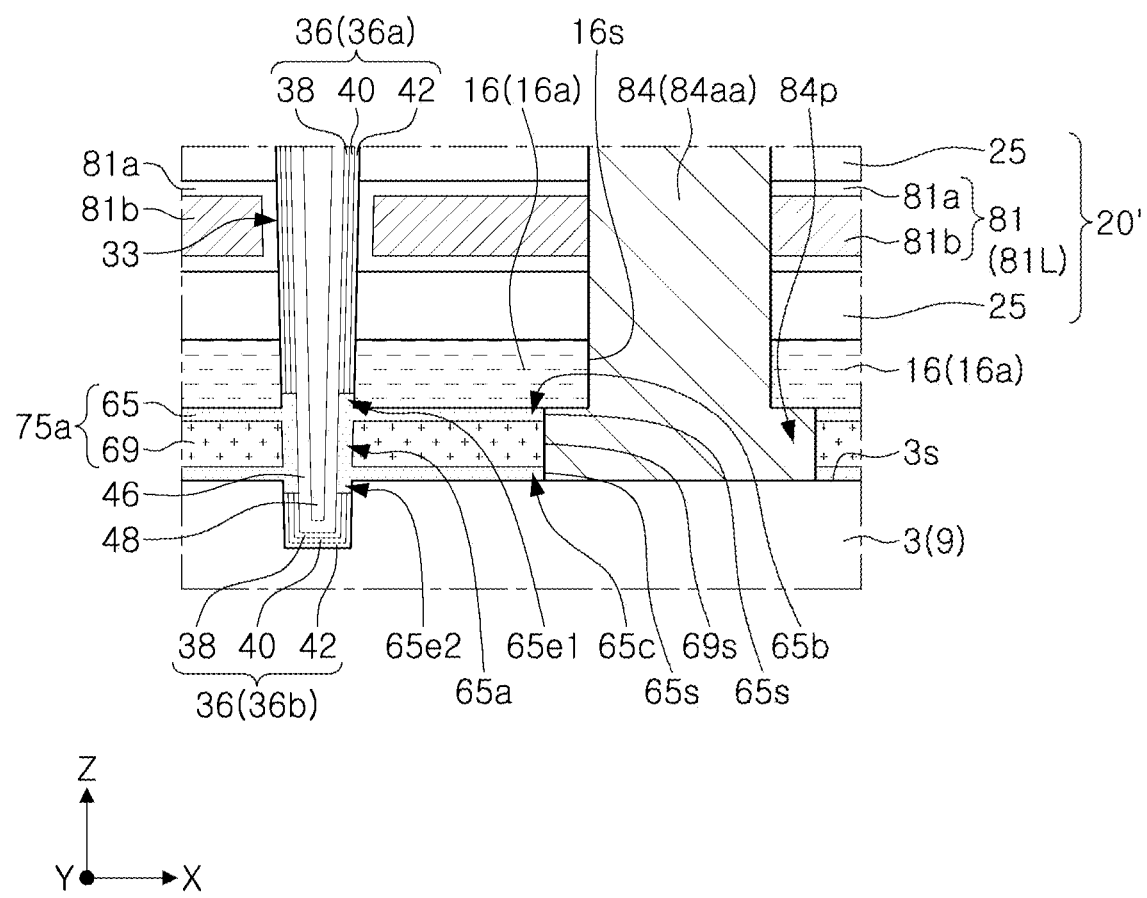
FIG. 4A is a partially enlarged cross-sectional view of a modified example embodiment of a semiconductor device according to example embodiments.
Figure 4B:
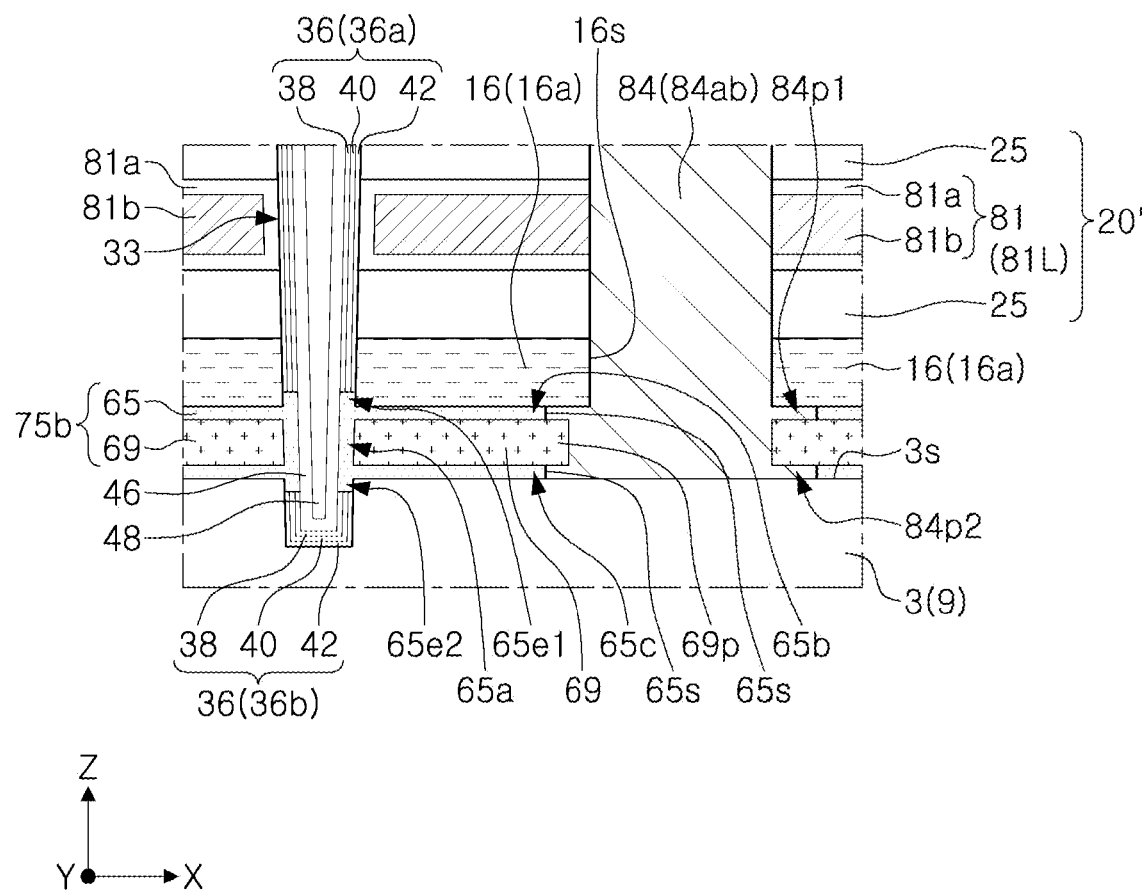
FIG. 4B is a partially enlarged cross-sectional view of a modified example embodiment of a semiconductor device according to example embodiments.
Figure 4C:
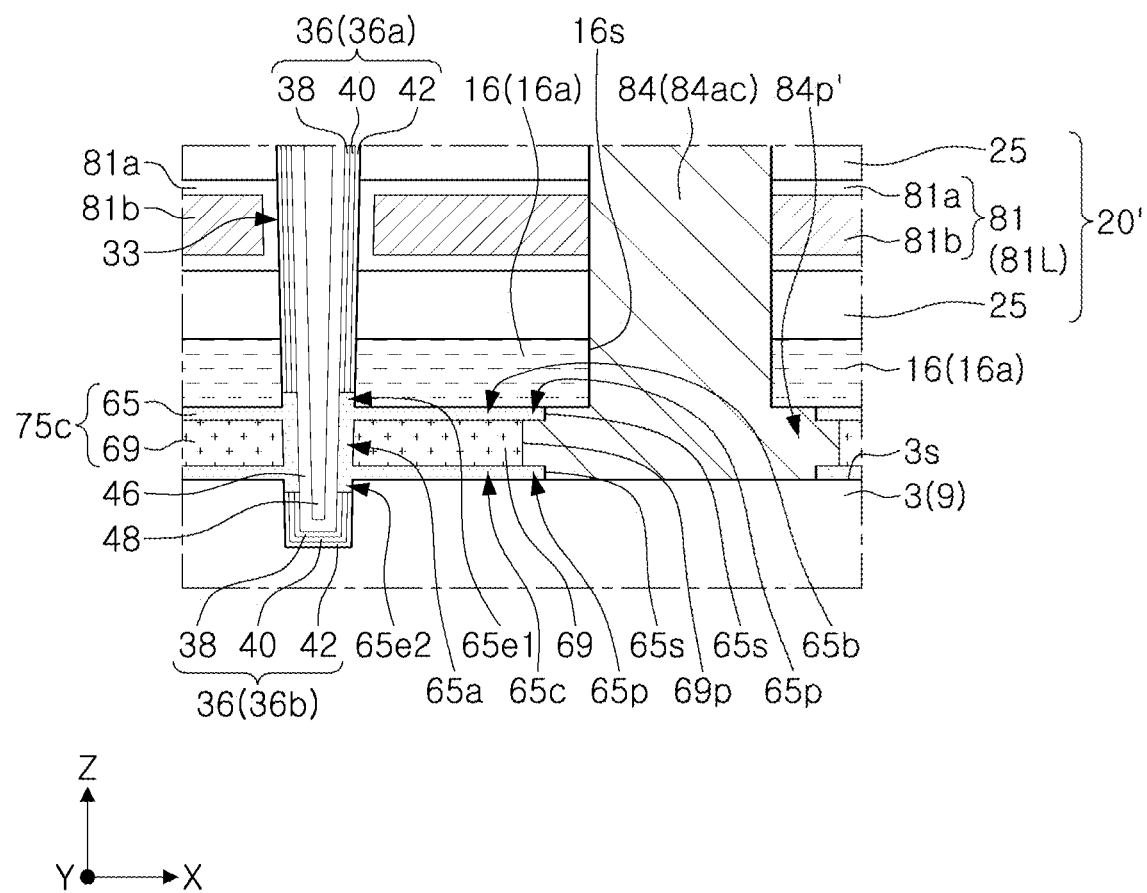
FIG. 4C is a partially enlarged cross-sectional view of a modified example embodiment of a semiconductor device according to example embodiments.

Various modified example embodiments of the lower structure 75 and the first separation portion 84a will be described with reference to FIGS. 4A to 4C. FIGS. 4A to 4C are partially enlarged cross-sectional views illustrating various modified example embodiments of region "B" of FIG. 1.

In a modified example embodiment, based on FIG. 4A, the lower structure (75 of FIGS. 1A to 3B) previously described with reference to FIGS. 1A to 3B may be replaced with a lower structure 75a having recessed side surfaces 65s and 69s. For example, in the lower structure 75a, the side surface 65s of the first lower pattern 65 and that of the second lower pattern 69s may be more recessed compared to that 16s of the upper pattern 16. The separation structure (84 of FIGS. 1A to 3B) previously described with reference to FIGS. 1A to 3B may be replaced with a first separation portion 84aa having a protrusion portion 84p extending to a region between the substrate structure 3 and the upper pattern 16.

In a modified example embodiment, based on FIG. 4B, the lower structure (75 of FIGS. 1A to 3B) previously described with reference to FIGS. 1A to 3B may be replaced with a lower structure 75b including a protrusion portion 69p. For example, the first lower pattern 65 in the lower structure 75b may be modified to have a recessed side surface 65s, and the second lower pattern 69 may be modified to include a protrusion portion 69p in a first horizontal direction X compared to the first lower pattern 65. The first horizontal direction may refer to a direction parallel to an upper surface 3s of the substrate structure 3. The first separation portion 84a of the separation structure (84 of FIGS. 1A to 3B) previously described with reference to FIGS. 1A to 3B may be replaced with a first separation portion 84ab including a portion 84p1 extending to a region between the upper pattern 16 and the second lower pattern 69 and a first separation portion 84ab including the substrate structure 3 and the second lower pattern 69. The protrusion portion 69p of the second lower pattern 69 may be protruded in the first horizontal direction X facing the first separation portion 84ab compared to the first lower pattern 65.

In a modified example embodiment, based on FIG. 4C, the lower structure (75 of FIGS. 1A to 3B) previously described with reference to FIGS. 1A to 3B may be replaced with a lower structure 75 including recessed side surfaces 65sa and 69sa. For example, in the lower structure 75c, the first lower pattern 65 may be modified to have a more recessed side surface 65sa than the side surface 16s of the upper pattern 16. The second lower pattern 69 may be modified to have a more recessed side surface 69sa than the side surface 16s of the first lower pattern 65. Accordingly, the first lower pattern 65 may include a protrusion portion 65p in the horizontal direction compared to the second lower pattern 69. The separation structures 84 (84 of FIGS. 1A to 3B) previously described with reference to FIGS. 1A to 3B may be replaced with a first separation portion 84ac including a portion 84p' extended to a region between the upper pattern 16 and the substrate structure 3. In the first separation portion 84ac, a center region of the portion 84p' extended to a region between the upper pattern 16 and the substrate structure 3 may extend to a region between the second portion 65b of the first lower pattern 65 and the third portion 65c.

Figure 4D:
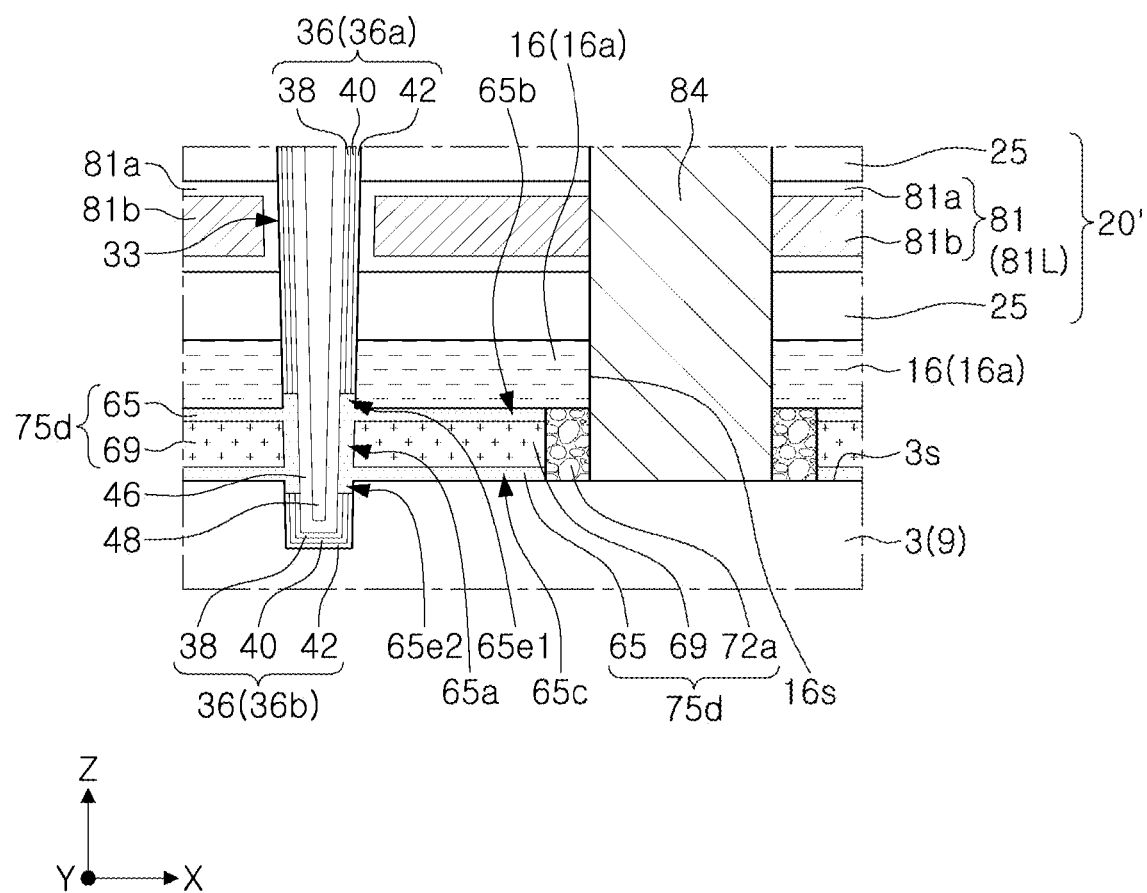
FIG. 4D is a partially enlarged cross-sectional view of a modified example embodiment of a semiconductor device according to example embodiments.
Figure 4E:
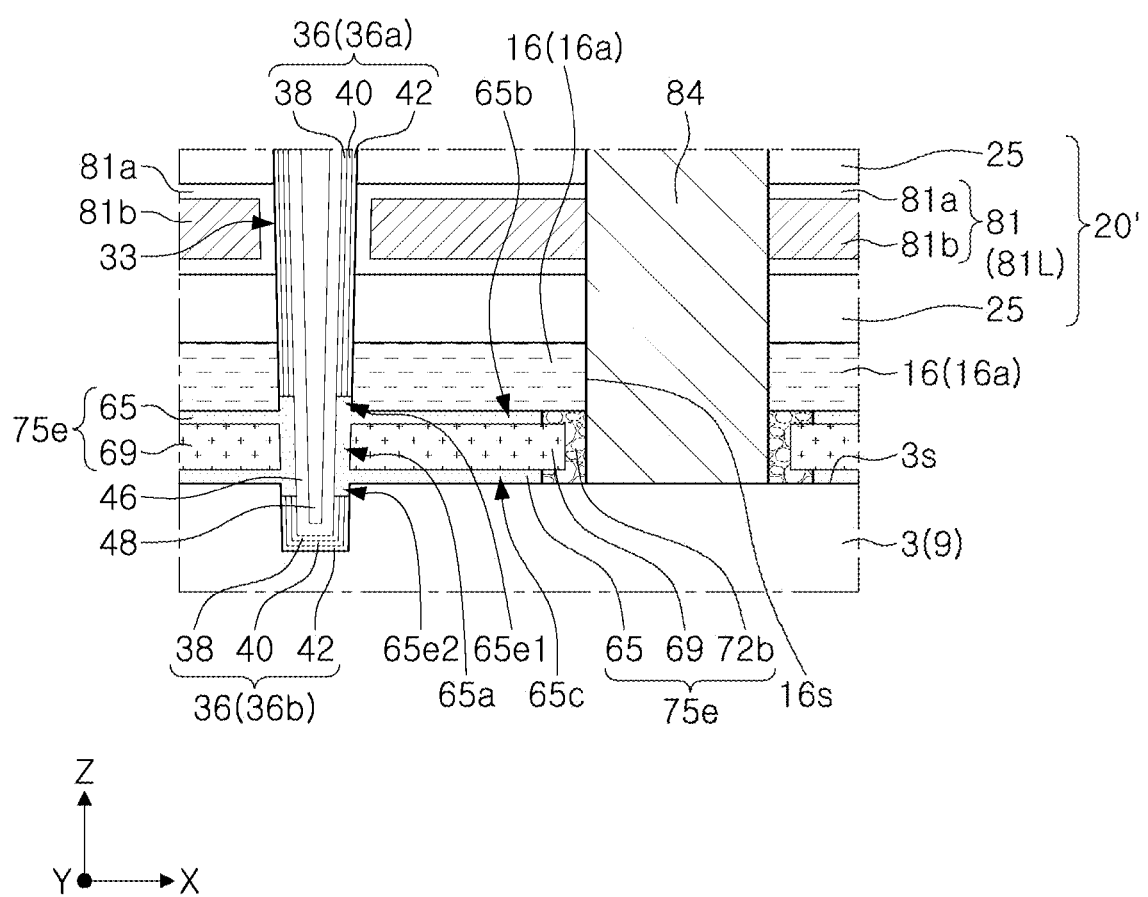
FIG. 4E is a partially enlarged cross-sectional view of a modified example embodiment of a semiconductor device according to example embodiments.
Figure 4F:
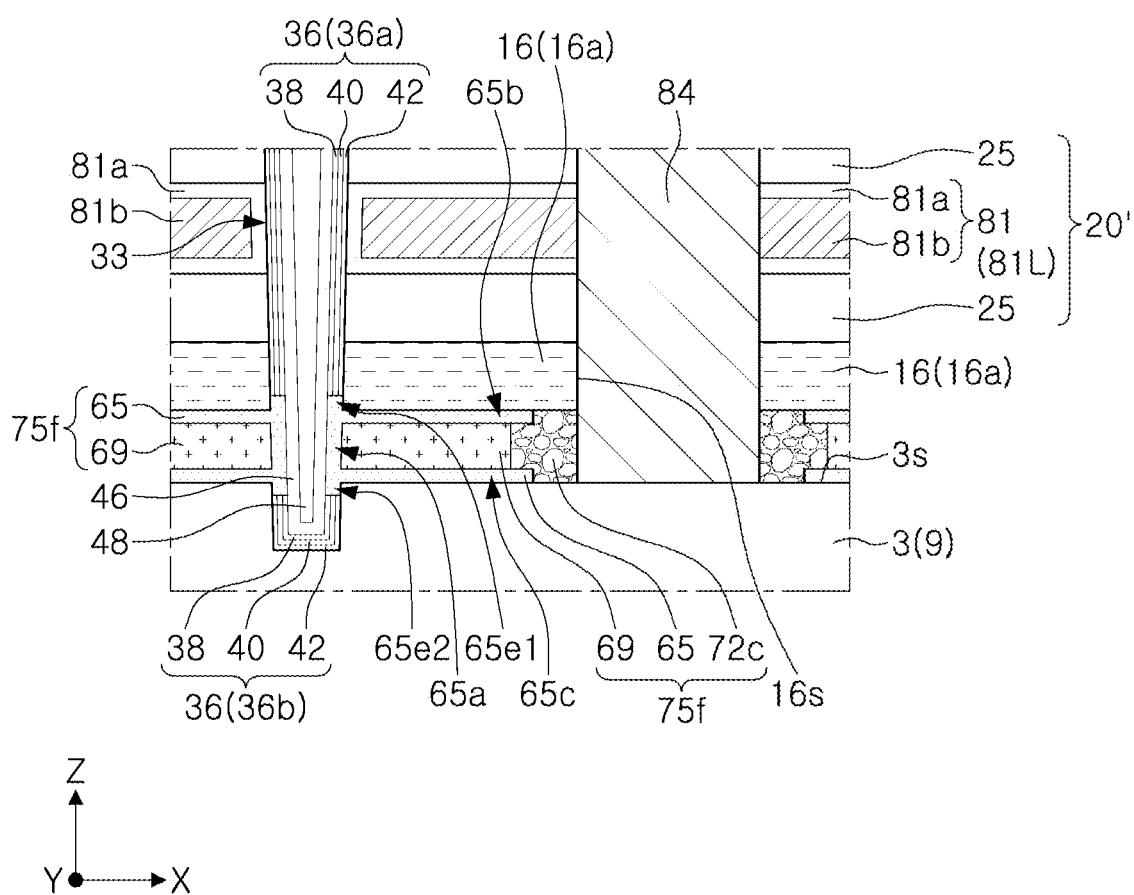
FIG. 4F is a partially enlarged cross-sectional view of a modified example embodiment of a semiconductor device according to example embodiments.

Various modified example embodiments of the lower structure 75 and the first separation portion 84a will be described with reference to FIGS. 4D to 4F. FIGS. 4D to 4F are partially enlarged cross-sectional views illustrating various modified example embodiments of region "B" of FIG. 1.

In a modified example embodiment, based on FIG. 4D, the lower structure (75a of FIG. 4A) previously described with reference to FIG. 4A may be modified to a lower structure 75d further including a third lower pattern 72a. In the lower structure 75d, the third lower pattern 72a may be disposed between the first and second lower patterns 65 and 69 on the lower structure (75a of FIG. 4A) and the separation structure 84. The third lower pattern 72a may be formed of a polysilicon. The second lower pattern may be formed of a material having etching selectivity to a material of the upper pattern 16, the first lower pattern 65 and the third lower pattern 72a. For example, the upper pattern 16, the first lower pattern 65 and the third lower pattern 72a may be formed of a polysilicon, the second lower pattern may be formed of a material having etching selectivity to the polysilicon. For example, the second lower pattern may be formed of an insulating material (e.g., silicon oxide) or a conductive material (e.g., TiN, TaN, WN, TiSi, WSi, TaSi, W, Ta, Ti, or the like) different from a polysilicon.

In a modified example embodiment, based on FIG. 4E, the lower structure (75b of FIG. 4B) previously described with reference to FIG. 4B may be modified to be a lower structure 75e further including a third lower pattern 72b. In the lower structure 75e, the third lower pattern 72b may be disposed between the first and second lower patterns 65 and 69 on the lower structure (75b of FIG. 4B) and the separation structure 84. The third lower pattern 72b may be formed of a polysilicon.

In a modified example embodiment, based on FIG. 4F, the lower structure (75c of FIG. 4C) previously described with reference to FIG. 4C may be modified to be a lower structure 75f further including a third lower pattern 72c. In the lower structure 75f, the third lower pattern 72c may be disposed between the first and second lower patterns 65 and 69 on the lower structure (75c of FIG. 4C) and the separation structure 84. The third lower pattern 72c may be formed of a polysilicon.

A method for manufacturing a semiconductor device according to example embodiments of the present disclosure will be described with reference to FIGS. 5A to 5E. FIGS. 5A to 5E are cross-sectional views of regions taken along line I-I' of FIG. 1.

Based on FIGS. 1 to 5A, a substrate structure 3 may be prepared. The substrate structure 3 may include a lower substrate 5, a peripheral circuit region 7 on the lower substrate 5 and an upper substrate 9 on the peripheral circuit region 7.

In some example embodiments, the lower substrate 5 may be a semiconductor substrate such as a single crystal silicon substrate, or the like.

In some example embodiments, the upper substrate 9 may be a polysilicon substrate. The upper substrate 9 may be an N-type conductive polysilicon substrate.

In some example embodiments, the peripheral circuit region 7 may include a peripheral circuit 7a and a lower insulating layer 7b covering the peripheral circuit 7a.

A sacrificial pattern 14 having an opening 14a may be formed on the substrate structure 3.

An upper pattern 16 may be formed on the sacrificial pattern 14.

The upper pattern 16 may include a horizontal portion 16a covering an upper surface of the sacrificial pattern 14 and a support portion 16b extending from the horizontal portion 16a filling the opening 14a.

A stacked structure 20 may be formed on the upper pattern 16.

In some example embodiments, the stacked structure 20 may include a lower stacked structure 20L and an upper stacked structure 20U.

The lower structure 20L and the upper stacked structure 20U may include alternately and repeatedly stacked interlayer insulating layers 25 and sacrificial horizontal layers 28.

In the lower structure 20L and the upper stacked structure 20U, uppermost and lowermost layers of the interlayer insulating layers 25 and the sacrificial horizontal layers 28 may be insulating layers.

In the lower structure 20L and the upper stacked structure 20U, the uppermost layer of the interlayer insulating layers 25 may be thicker than those between the sacrificial horizontal layers 28.

In some example embodiments, the interlayer insulating layers 25 may be formed of a silicon oxide.

In some example embodiments, the sacrificial horizontal layers 28 may be formed of a material, such as a silicon nitride, having etching selectivity to the interlayer insulating layers 25.

In some example embodiments, the sacrificial horizontal layers 28 may be formed of a conductive material.

An insulating separation pattern 30 may be formed partially inside the upper stacked structure 20U. The insulating separation pattern 30 may pass through a single or a plurality of sacrificial horizontal layers 28 located in an upper portion of the upper stacked structure 20U.

A vertical structure 33 passing through the stacked structure 20, the upper pattern 16 and the sacrificial pattern 14 in that order and extending into the upper substrate 9 of the substrate structure 3 may be formed.

In some example embodiments, the formation of the vertical structure 33 may include passing through the stacked structure 20, the upper pattern 16 and the sacrificial pattern 14 in order, forming a channel hole 32 extending into the upper substrate 9 of the substrate structure 3, forming a dielectric structure (36 of FIG. 3A) covering an inner wall of the channel hole 32, forming a channel layer (46 of FIG. 3A) covering the dielectric structure (36 of FIG. 3A), forming a core region (48 of FIG. 3A) partially filling the channel hole (32 of FIG. 3A) on the channel layer (46 of FIG. 3A), and forming a pad pattern (50 of FIG. 3A) partially filling a remaining region of the channel hole 32 on the core region (48 of FIG. 3A).

The vertical structures 33 may be formed in plural. Among a plurality of the vertical structures 33, some of the vertical structures (33d of FIG. 1) may pass through the insulating separation pattern 30. As previously described, some of the vertical structures (33d of FIG. 1) passing through the insulating separation pattern 30 may be a dummy vertical structure.

Based on FIGS. 1 to 5B, a first upper insulating layer 53 may be formed on the stacked structure 20. Separation trenches 56 passing through the first upper insulating layer 53 and the stacked structure 20 may be formed. Protective spacers 58 may be formed on side surfaces of the separation trenches 56.

Figure 5A:
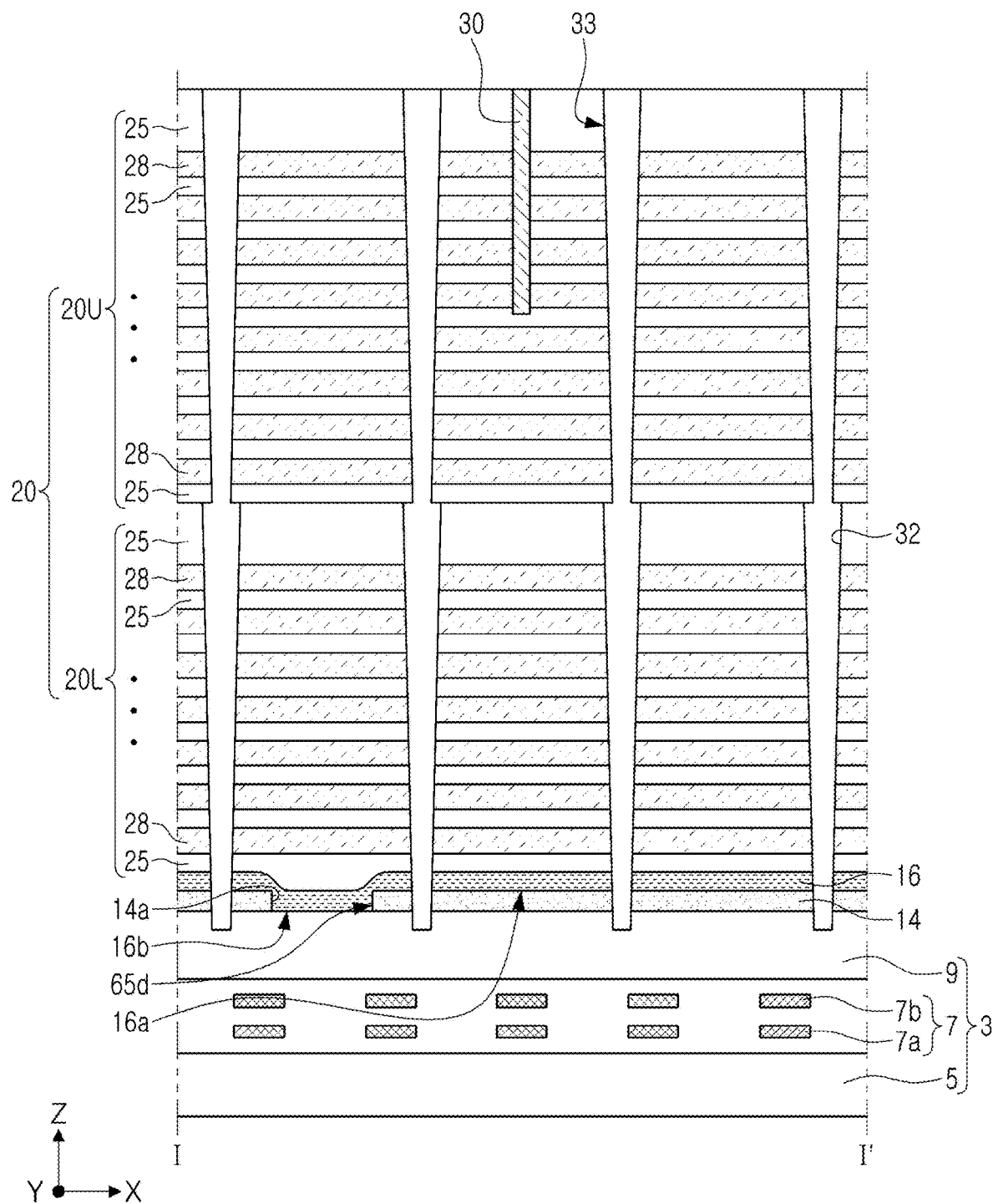
FIGS. 5A to 5E are cross-sectional views of a method for manufacturing a semiconductor device according to example embodiments.

The separation trenches 56 may expose a portion of the upper pattern 16 while exposing the sacrificial pattern (14 of FIG. 5A).

Each separation trench 56 may include a portion passing through the horizontal portion 16a and a portion overlapping with the support portion 16b of the upper pattern 16.

A lower space 60 may be formed by removing the exposed sacrificial pattern (14 of FIG. 5A).

In some example embodiments, the channel layer 46 of the vertical structure 33 may be exposed by removing the exposed sacrificial pattern (14 of FIG. 5A).

The support portion 16b of the upper pattern 16 may reduce or prevent the stacked structure 20 from collapse or being modified.

Based on FIGS. 1 to 5C, a first lower layer 64 conformally covering side walls of the separation trenches 56 and the lower space 60 may be formed.

A second lower layer 68 may be formed on the first lower layer 64. The second lower layer 68 fills the lower space 60 and may extend into the separation trenches 56.

In some example embodiments, the first lower layer 64 may be formed of an amorphous silicon material.

In some example embodiments, the second lower layer 68 may be formed of a material having etching selectivity to the first lower layer 64. For example, the second lower layer 68 may be formed of an insulating material, for example, a silicon oxide. In some example embodiments of the present disclosure, the second lower layer 68 may be replaced with a material different from the silicon oxide.

Based on FIGS. 1 to 5C, a second lower pattern 69 remained inside the lower space 60 may be formed by partially etching the second lower layer 68. A first lower pattern 65 remained inside the lower space 60 may be formed by partially etching the first lower layer 64.

The sacrificial horizontal layers 28 may be exposed by removing the protective spacer 58.

In some example embodiments, after the first and second lower patterns 65 and 69, annealing is performed to form the amorphous silicon material of the first lower layer 64 as a polysilicon material. Accordingly, the first lower layer 64 may be formed of a polysilicon material.

Based on FIGS. 1 to 5C, empty spaces 78 may be formed by removing the sacrificial horizontal layer 28 exposed by removing the protective spacers 58.

Based on FIGS. 1 to 3B, horizontal layers 81 filling the empty spaces (78 of FIG. 5E) may be formed.

Figure 5B:
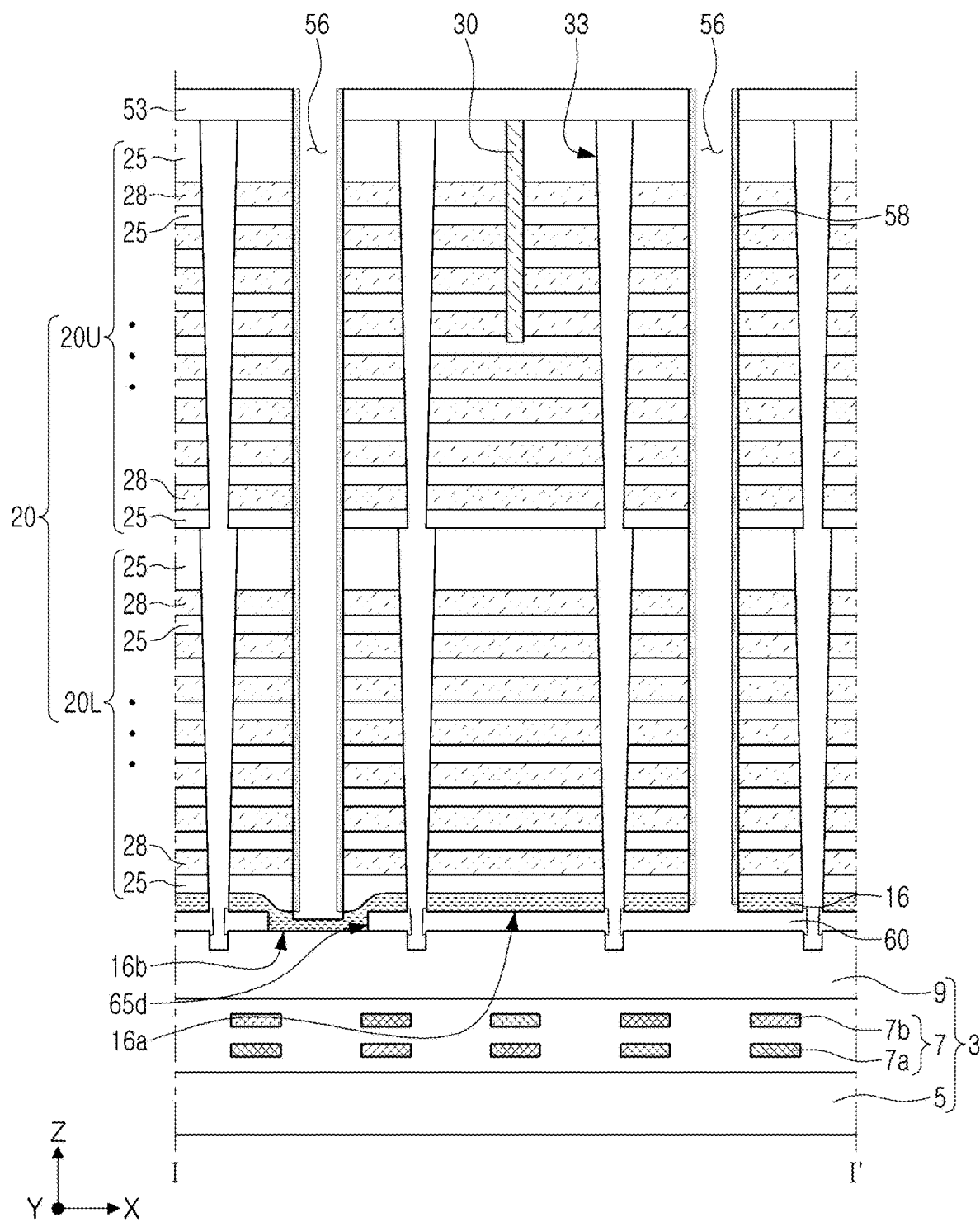
Figure 5C:
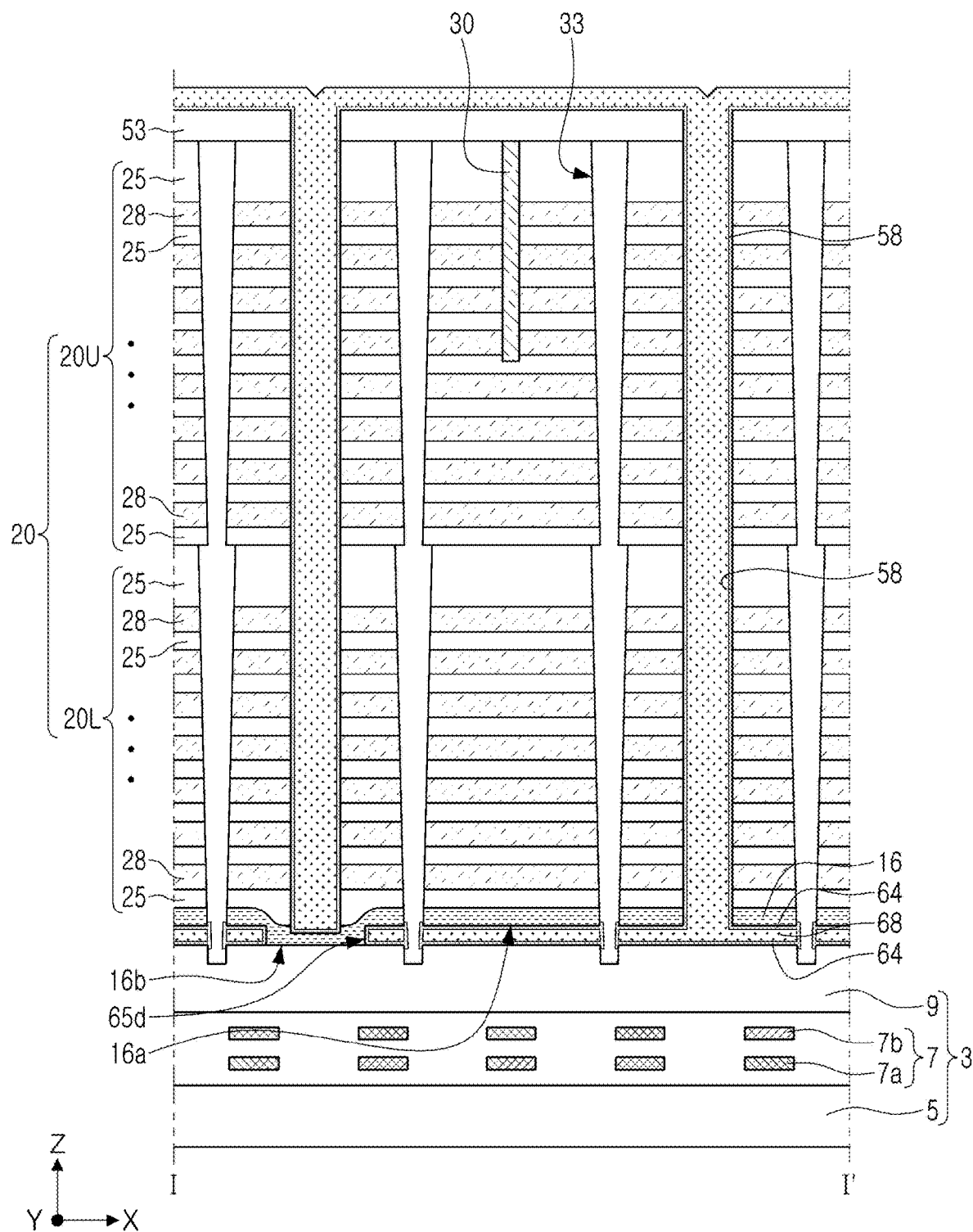
Figure 5D:
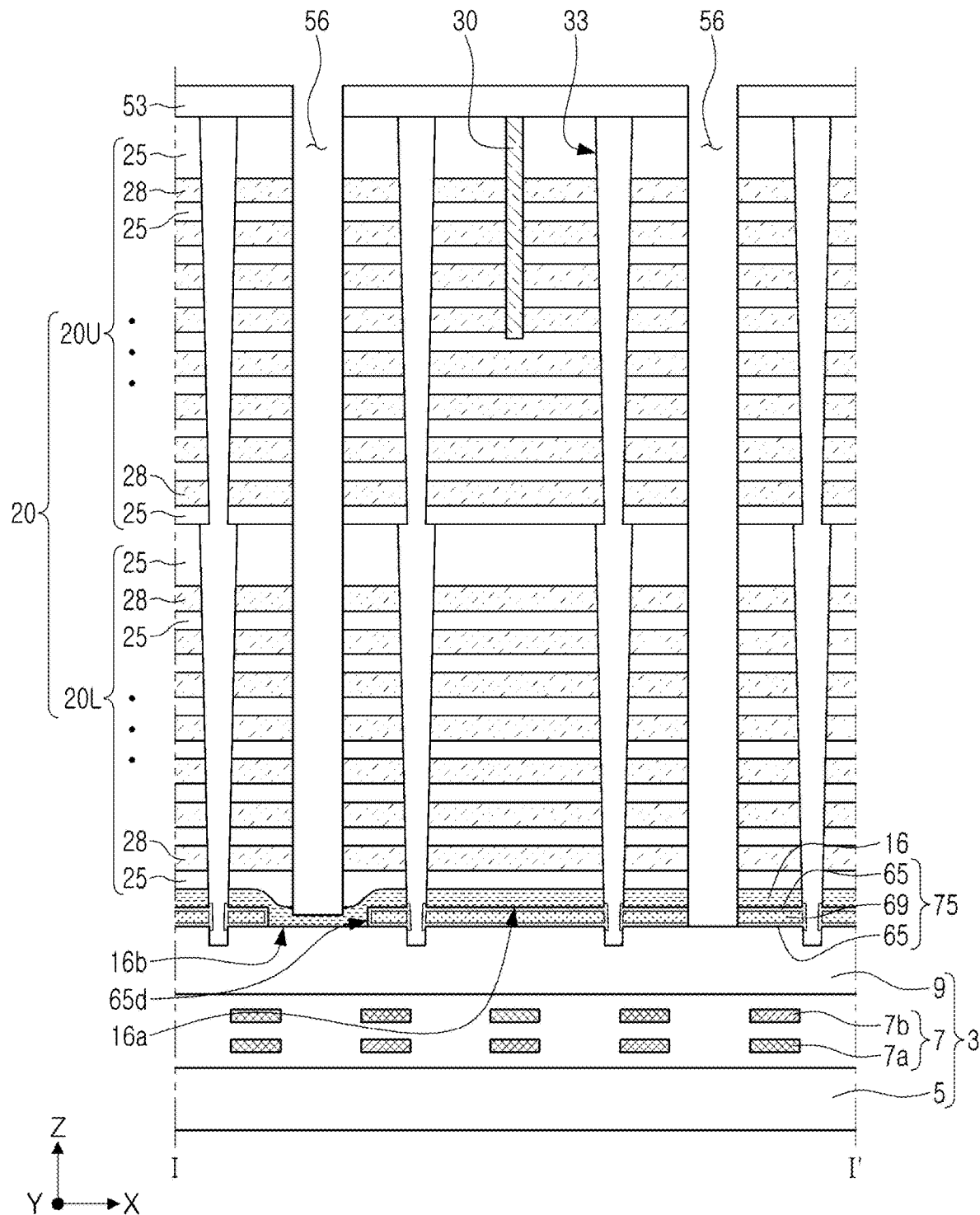
Figure 5E:
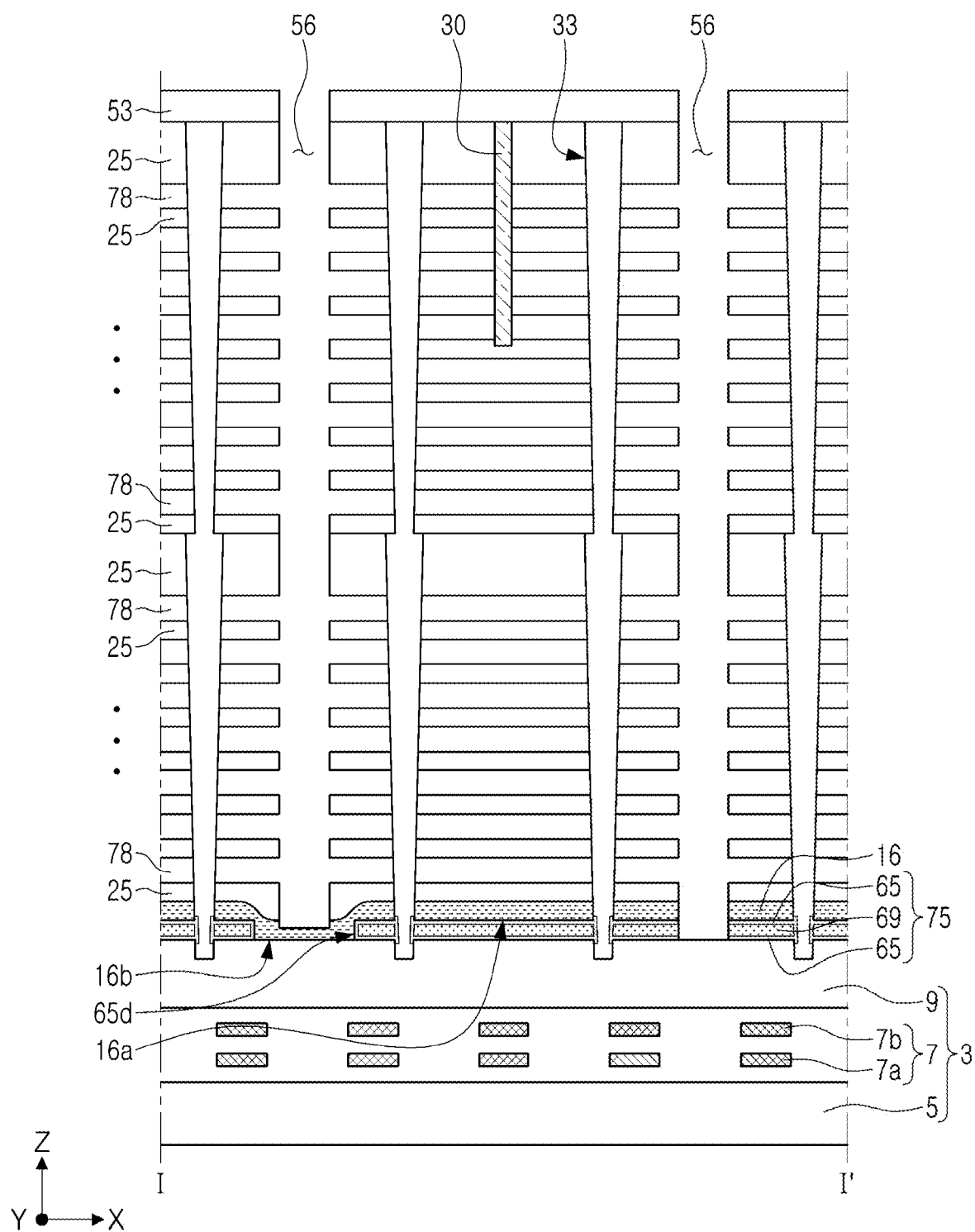

The formation of the horizontal layers 81 may include forming a second layer (81b of FIG. 3A) filling the empty spaces (78 of FIG. 5E) on the first layer (81a of FIG. 3A) and the first layer (81a of FIG. 3A) covering the inner wall of the empty spaces (FIG. 5E).

Separation structures 84 filling the separation trenches 56 may be formed. A second upper insulating layer 87 covering the separation structures 84 and the first upper insulating layer 53 may be formed. A contact plug 90 passing through the first and second upper insulating layers 53 and 87 and electrically connected to the pad pattern 50 of the vertical structure 33 may be formed. A conductive line 93 may be formed on the contact plug 90.

In embodiments, after the empty space (60 of FIG. 5B) is formed as in FIG. 5B, the method described in FIGS. 5C and 5D is used to fill the empty space (60 of FIG. 5B) with the first and second lower patterns 65 and 69, thereby stably manufacturing the lower structure 75 including the first and second lower patterns 65 and 69 with reliability. Accordingly, a defect, which may occur from including a doped polysilicon material inside the empty space (60 of FIG. 5B), may be reduced or prevented. As the lower structure 75 filling the empty space (60 of FIG. 5B) may be formed to have a stable structure, reliability of the semiconductor device can be improved.

According to embodiments of the present disclosure, a method for stably and/or reliably forming a first lower pattern of a lower structure in contact with a channel layer passing through a stacked structure between a substrate and the stacked structure is disclosed. As a semiconductor device including the lower structure formed by such method is provided, reliability of the semiconductor device can be improved.

While example embodiments have been shown and described above with referent to the accompanying drawings, it is apparent to those skilled in the art that modifications and variations could be made without departing from the scope of the inventive concepts as defined by the appended claims.

What is claimed is:

1. A semiconductor device, comprising:
a substrate structure;
a lower structure on the substrate structure;
an upper pattern on the lower structure;
a stacked structure on the lower structure;
separation structures passing through the stacked structure;
a vertical structure between the separation structures and passing through the stacked structure, the upper pattern and the lower structure and extending into the substrate structure and comprising a channel layer;
a contact plug on the vertical structure; and
a conductive line on the contact plug,
wherein the stacked structure comprises a plurality of interlayer insulating layers and a plurality of gate layers alternately and repeatedly stacked,
the lower structure comprises a first lower pattern and a second lower pattern of a material different from a material of the first lower pattern,
the first lower pattern comprises a first portion between the second lower pattern and the channel layer, a second portion extending from the first portion to a region between the second lower pattern and the upper pattern, and a third portion extending from the first portion to a region between the second lower pattern and the substrate structure,
wherein the vertical structure further comprises a first dielectric structure and a second dielectric structure in contact with the channel layer,
wherein the first dielectric structure is between the channel layer and the stacked structure and extends to a region between the upper pattern and the channel layer, and
the second dielectric structure is between the channel layer and the substrate structure, and
the first dielectric structure and the second dielectric structure are spaced apart from each other by the first lower pattern.

2. The semiconductor device of claim 1, wherein:
the first portion, the second portion the third portion, and the upper pattern are formed of polysilicon,
the second lower pattern is formed of a material different from the polysilicon, and
a lowermost gate layer among the plurality of gate layers is spaced apart from the upper pattern.

3. The semiconductor device of claim 2, wherein:
the second lower pattern is of a silicon oxide.

4. The semiconductor device of claim 1, wherein the first lower pattern further comprises an upper extending portion extending from the first portion to a region between the upper pattern and the channel layer, and a lower extending portion extending to a region between the substrate structure and the channel layer,
wherein the upper extending portion is in contact with the first dielectric structure, and
the lower extending portion is in contact with the second dielectric structure.

5. The semiconductor device of claim 1, wherein:
the first dielectric structure comprises a first dielectric layer, a second dielectric layer, and a data storage material layer between the first and second dielectric layers.

6. The semiconductor device of claim 1, wherein the first and second lower patterns have side surfaces more recessed than side surfaces of the upper pattern.

7. The semiconductor device of claim 1, wherein the second lower pattern comprises a portion protruding in a horizontal direction compared to the first lower pattern, and
the horizontal direction is a direction parallel to an upper surface of the substrate structure.

8. The semiconductor device of claim 1, wherein:
the first lower pattern comprises a portion protruding in a horizontal direction compared to the second lower pattern, and
the horizontal direction is a direction parallel to an upper surface of the substrate structure.

9. The semiconductor device of claim 1, wherein the lower structure further comprises a third lower pattern,
wherein the third lower pattern is between the separation structure and the first lower pattern, and between the second lower pattern and the separation structure.

10. The semiconductor device of claim 1, wherein the upper pattern comprises an upper portion parallel to an upper surface of the substrate structure and a support portion extending from the upper portion and in contact with the substrate structure,
the lower structure is between the upper portion of the upper pattern and the substrate structure,
the lower structure comprises a first side surface in contact with the support portion of the upper pattern and a second side surface in contact with the separation structures, and
the first lower pattern extends to a region between the support portion of the upper pattern and the second lower pattern.

11. The semiconductor device of claim 1, wherein:
the substrate structure comprises a lower substrate, a peripheral circuit region on the lower structure, and an upper substrate on the peripheral circuit region,
wherein the lower structure is in contact with the upper substrate and on the upper substrate, the upper substrate is spaced apart from the lower substrate,
the upper substrate is at a higher level than the peripheral circuit region,
the first portion, the second portion the third portion contact the second lower pattern, and
the lower end of the channel layer is at a lower level than a lower end of the separation structures.

12. The semiconductor device of claim 1, wherein the stacked structure comprises a lower stacked structure and an upper stacked structure on the lower stacked structure,
wherein each of the lower stacked structure and the upper stacked structure comprises a plurality of interlayer insulating layers and a plurality of gate layers alternately and repeatedly stacked, an uppermost layer of a plurality of the interlayer insulating layers and a plurality of the gate layers in each of the lower and upper stacked structures is an interlayer insulating layer, and the uppermost interlayer insulating layer in each of the lower and upper stacked structures is an interlayer insulating layer has a thickness greater than a thickness of each of the interlayer insulating layers between a plurality of the gate layers.

13. The semiconductor device of claim 1, wherein the the upper pattern directly on an upper surface of the second portion, the upper surface of the second portion contacts a lower surface of the upper pattern, and a lower end of the channel layer is at a lower level than a lower end of a first lower pattern.

14. A semiconductor device, comprising:

a lower structure on a substrate;

an upper pattern on the lower structure;

a stacked structure on the lower structure;

a vertical structure passing through the stacked structure, the upper pattern and the lower structure and extending into the substrate; and a separation structure passing through the stacked structure, the upper pattern and the lower structure and spaced apart from the vertical structure, wherein the upper pattern comprises an upper portion parallel to the upper surface of the substrate and a support portion extending from the upper portion and in contact with the substrate, the lower structure is between the upper portion of the upper pattern and the substrate, the separation structure comprises a first separation portion passing through the stacked structure, the upper portion of the upper pattern and the lower structure, and a second separation portion passing through the stacked structure and in contact with the support portion of the upper pattern, the stacked structure comprises a plurality of gate layers stacked spaced apart in a direction perpendicular to an upper surface of the substrate, the vertical structure comprises a channel layer passing through a plurality of gate layers, the upper portion of the upper pattern, and the lower structure and extending into the substrate, the lower structure comprises a first lower pattern and a second lower pattern of a material different from a material of the first lower pattern, the first lower pattern comprises a first portion between the second lower pattern and the channel layer, a second portion extending from the first portion to a region between the second lower pattern and the upper pattern, and a third portion extending from the first portion to a region between the second lower pattern and the substrate, wherein the vertical structure further comprises a first dielectric structure and a second dielectric structure in contact with the channel layer, wherein the first dielectric structure is between the channel layer and the stacked structure and extends to a region between the upper pattern and the channel layer, the second dielectric structure is between the channel layer and the substrate, and the first lower pattern further comprises an upper extension portion extending from the first portion to a region between the upper pattern and the channel layer and a lower extension portion from the first portion extending to a region between the substrate and the channel layer, wherein the upper extension portion is in contact with the first dielectric structure, and the lower extension portion is in contact with the second dielectric structure.

15. The semiconductor device of claim 14, wherein:

the lower structure further comprises a third lower pattern between the first separation portion of the separation structure and the first and second lower patterns.

16. The semiconductor device of claim 14, wherein the upper pattern directly on an upper surface of the second portion, the upper surface of the second portion contacts a lower surface of the upper pattern, a lower end of the channel layer is at a lower level than a lower end of a first lower pattern, a lowermost gate layer among the plurality of gate layers is spaced apart from the upper pattern, and the upper portion and the support portion of the upper pattern are at a lower level than a lowermost gate layer among the plurality of gate layers.

17. A semiconductor device, comprising:

a lower structure on a substrate;

an upper pattern on the lower structure;

a stacked structure on the upper pattern;

a vertical structure passing through the stacked structure, and the lower structure and the upper pattern and extending into the substrate; and a separation structure passing through the stacked structure, the upper pattern and the lower structure and spaced apart from the vertical structure, wherein the stacked structure comprises a plurality of gate layers spaced apart in a direction perpendicular to an upper surface of the substrate while being stacked, the vertical structure comprises a channel layer passing through a plurality of the gate layers, the upper pattern and the lower structure and extending into the substrate, and the lower structure comprises a first lower pattern and a second lower pattern of a material having etching selectivity with respect to the first lower pattern, wherein the first lower pattern comprises a first portion between the second lower pattern and the channel layer, a second portion extending from the first portion to a region between the second lower pattern and the upper pattern, and a third portion extending from the first portion to a region between the second lower pattern and the substrate, at least one of the second portion of the first lower pattern, the third portion of the first lower pattern and the second lower pattern has a side surface recessed more than a side surface of the upper pattern, wherein the vertical structure further comprises a first dielectric structure and a second dielectric structure in contact with the channel layer, wherein the first dielectric structure is between the channel layer and the stacked structure and extends to a region between the upper pattern and the channel layer, the second dielectric structure is between the channel layer and the substrate, and the first lower pattern further comprises an upper extension portion extending from the first portion to a region between the upper pattern and the channel layer and a lower extension portion from the first portion extending to a region between the substrate and the channel layer, wherein the upper extension portion is in contact with the first dielectric structure, and the lower extension portion is in contact with the second dielectric structure.

18. The semiconductor device of claim 17, wherein the second lower pattern comprises a protrusion portion protruding in a horizontal direction and facing the separation structure compared to the first lower pattern, and the horizontal direction is a direction parallel to the upper surface of the substrate.

19. The semiconductor device of claim 17, wherein at least one of the second portion of the first lower pattern and the third portion of the first lower pattern comprises a portion protruding in a horizontal direction facing the separation structure compared to the second lower pattern, and the horizontal direction is a direction parallel to the upper surface of the substrate.

20. The semiconductor device of claim 17, wherein the lower structure further comprises a third lower pattern between the first and second lower patterns and the separation structure, the upper pattern, the first lower pattern and the third lower pattern are of a polysilicon, and the second lower pattern is of a material having etching selectivity to the polysilicon.

* * * * *